United States Patent [19]

Tachikawa et al.

[11] 4,356,255

[45] Oct. 26, 1982

[54] PHOTOSENSITIVE MEMBERS AND A PROCESS FOR FORMING PATTERNS USING THE SAME

[75] Inventors: Hiromichi Tachikawa; Yohnosuke Takahashi; Fumiaki Shinozaki; Tomoaki Ikeda, all of Asaka, Japan

[73] Assignee: Fuji Photo Film Co., Ltd., Kanagawa, Japan

[21] Appl. No.: 164,399

[22] Filed: Jun. 30, 1980

[30] Foreign Application Priority Data

Jun. 28, 1979 [JP] Japan ................. 54-81659

[51] Int. Cl.$^3$ ............... G03C 5/00; G03C 7/08; G03C 1/495; G03C 1/60; G03C 5/18
[52] U.S. Cl. ................. 430/325; 430/165; 430/190; 430/191; 430/192; 430/326; 430/328; 430/330
[58] Field of Search ............ 430/191, 190, 325, 326, 430/177, 193, 196, 328, 330, 165

[56] References Cited

U.S. PATENT DOCUMENTS

| | | | |
|---|---|---|---|
| 2,322,982 | 6/1943 | Von Poser | 430/177 |
| 2,378,583 | 6/1945 | Schmidt | 430/177 |
| 2,694,010 | 11/1954 | Botkin et al. | 430/193 |
| 3,567,453 | 3/1971 | Borden | 430/191 |
| 3,778,274 | 12/1973 | Inoue et al. | 430/191 |
| 3,844,793 | 10/1974 | Singh | 430/196 |
| 3,984,250 | 10/1976 | Holstead et al. | 430/196 |
| 4,164,421 | 8/1979 | Shinozaki et al. | 430/165 |
| 4,196,003 | 4/1980 | Watanabe | 430/196 |
| 4,259,430 | 3/1981 | Kaplan et al. | 430/330 |
| 4,275,139 | 6/1981 | Stahlhofer | 430/191 |

FOREIGN PATENT DOCUMENTS 2547905  4/1977  Fed. Rep. of Germany ...... 430/191

*Primary Examiner*—Charles L. Bowers
*Attorney, Agent, or Firm*—Sughrue, Mion, Zinn, Macpeak & Seas

[57] ABSTRACT

A photosensitive member comprising a photosensitive layer containing an o-quinonediazide compound as a photosensitive agent and an additive, characterized in that the additive is selected from a group consisting of quinone compounds and aromatic ketone compounds, and a method for forming an image using the same.

1 Claim, No Drawings

PHOTOSENSITIVE MEMBERS AND A PROCESS FOR FORMING PATTERNS USING THE SAME

BACKGROUND OF THE INVENTION

1. Field of the Invention

This invention relates to photosensitive members comprising a photosensitive layer containing as a photosensitive ingredient an o-quinonediazide compound, and, in particular, to photosensitive members which can work in both positive (i.e., forming a positive image from a positive original) and negative (i.e., forming a positive image from a negative original) modes.

2. Description of the Prior Art

As is well known, o-quinonediazide compounds are sensitive to light and used as the photosensitive agent in photosensitive coatings for pre-sensitized printing plates, photoresists, overhead projection films, etc.

When o-quinonediazide compounds are exposed to actinic radiation, the diazo moiety thereof decomposes to give rise to a carboxyl-containing compound. Accordingly, image exposure of a photosensitive coating containing such an o-quinonediazide compound followed by development with an alkaline developer causes dissolution of the exposed areas, leaving the unexposed areas on the substrate. Thus, a so-called positive working process results.

In contrast, negative working photosensitive compositions based on o-quinonediazide compounds are also known in which a solid compound having a free primary amino group incorporated in the photosensitive coating in addition to the o-quinonediazide promotes the insolubilization of the irradiated areas so that one can eliminate the unexposed areas to obtain a positive image from a negative. (See J. Kosar, *Light-Sensitive Systems*, John Wiley & Sons, Inc. (1965).)

Japanese patent application (OPI) Nos. 108002/75 (corresponding to British Pat. No. 1,492,620) (the term "OPI" as used herein refers to a "published unexamined Japanese patent application") and 127615/74 (corresponding to British Pat. No. 1,494,640) disclose a method of making a single photosensitive member containing an o-quinonediazide compound which functions in both the positive and the negative working modes. According to these references, a positive working process is achieved by using a photosensitive composition comprising an o-quinonediazide and at least one compound selected from the group consisting of secondary and tertiary amine compounds and compounds containing a hydroxyl group. When image formation is carried out by image-wise exposure to actinic radiation followed by development with an alkali whereby the exposed areas are removed to give a positive image. On the other hand, a negative working process is obtained by image-wise exposure, heating the photosensitive layer concurrent with or after exposure, blank exposure or exposure of the unexposed area to active radiation, and development with an alkali.

Another conventionally known method capable of image reversal with a single photosensitive material is based on the use of a silver halide photographic emulsion; while the emulsion can work in the positive mode with ordinary development, the image can be reversed by etch-bleaching the image obtained by ordinary development, followed by blank exposure and a second development. This method not only requires complicated procedures, but suffers from a noticeable degrading of image resolution during etch-bleaching.

Taking a general perspective of photoresist technology, one finds that positive working processes are based on the use of o-quinonediazide compounds with few exceptions, and, in contrast, a variety of photopolymers are employed for the image formation in negative working processes. However, the image resolution obtained with these photopolymers is inferior to that obtained with photosensitive members based on the o-quinonediazide in positive imaging.

On the other hand, negative working photopolymers having high resolving power are earnestly needed which are applicable to high density recording for forming semi-conductors in electronic industries. In the methods set forth in Japanese patent application (OPI) Nos. 108002/75 (corresponding to British Pat. Nos. 1,492,620) and 127615/74 (corresponding to British Pat. No. 1,494,640), a single photosensitive member operates in both positive and negative modes whereby patterns of high resolution with excellent edge acuity are obtained and the image resolution in the negative working mode exceeds that obtained with conventional photopolymers.

SUMMARY OF THE INVENTION

Accordingly, one object of the present invention is to provide a new photosensitive member which can work both in positive and negative modes and a method of forming images using the same.

Another object of the present invention is to provide a photosensitive member which can be developed by processing common to both positive and negative working image formation.

Still another object of the present invention is to provide photosensitive members useful for the preparation of photoresists for IC as well as printed circuits, printing masters, masking materials, etc.

The present invention provides a photosensitive member comprising a photosensitive layer containing an o-quinonediazide compound as a photosensitive agent and an additive which is selected from the group consisting of quinone compounds and aromatic ketone compounds and both positive working and negative working processes using the same.

DETAILED DESCRIPTION OF THE INVENTION

The o-quinonediazide compound used in the present invention must have at least one o-quinonediazide moiety in its molecular structure, and exhibits an increased solubility in alkaline solutions when irradiated with actinic radiation. Such compounds are described in detail in, for example, J. Kosar, *Light-Sensitive Systems*, John Wiley & Sons, Inc. (1965). Among those with various chemical structures, particularly preferred are the o-benzo- and o-naphthoquinonediazide sulfonic acid esters of a variety of hydroxyl compounds, including the following representative examples: 2,2'-dihydroxydiphenyl-bis-[naphthoquinone-1,2-diazide-5-sulfonic acid ester], 2,2',4,4'-tetrahydroxydiphenyl-tetra[naphthoquinone-1,2-diazide-5-sulfonic acid ester], 2,3,4-trioxybenzophenone-bis[naphthoquinone-1,2-diazide-5-sulfonic acid ester], etc. One can also employ the naphthoquinone-1,2-diazide-5-sulfonic acid ester of the polyhydroxybenzene resulting from the condensation polymerization of acetone and pyrogallol which is set forth in Japanese Patent Publication No. 28403/68 (corresponding to U.S. Pat. No. 3,635,709).

The quinone compounds most characteristic of the present invention are an anthraquinone such as anthraquinone, 1-methylanthraquinone, 2-methylanthraquinone, 2-t-butylanthraquinone, 1-acetylamino-4-nitroanthraquinone, 1,2-benzanthraquinone, 2,3-triazolylanthraquinone, etc.; and a phenanthraquinone such as phenanthraquinone, 1-methylphenanthraquinone, benzphenanthraquinone, etc. Suitable examples of the aromatic ketone compounds used in the present invention are perinaphthenone, xanthone, thioxanthone, benzanthrone, 3-chlorobenzanthrone, naphthofuranone, 4-phenylnaphthofuranone, indenone, 2,3-diphenylindenone, benzophenone, benzalacetophenone, etc.

The suitable amount of the above-cited compounds is about 0.005 to 1 part by weight and more preferably about 0.01 to 0.5 part by weight per part by weight of the o-quinonediazide compound.

The photosensitive resin composition prepared in accordance with the present invention can further contain a number of additives such as a pigment (e.g., phthalocyanine blue, etc.) or dye (e.g., malachite green, safranine, etc.) for image visualization.

Incorporation of resinous materials which are compatible with the above-cited essential ingredients and which are exemplified by styrene/maleic anhydride copolymer, styrene/acrylic acid copolymer, methyl methacrylate/methacrylic acid copolymer, etc., can improve the mechanical strength of the resulting image or pattern. Further explanations for these techniques will not be provided since they are well known to those skilled in the art.

The photosensitive composition thus prepared is spread on a suitable support including, for example, a metal plate (e.g., aluminum or zinc plate), paper, paper laminate (e.g., papers laminated with polyethylene, polystyrene, and other plastic films), plastic films such as, for example, poly(ethylene terephthalate), cellulose diacetate, cellulose triacetate, nitrocellulose, polycarbonate, poly(vinyl chloride), etc., or on a metal or inorganic thin layer (e.g., chrome, aluminum, zinc, a chalcogenide, etc.) deposited on a plastic or glass support such as those cited above.

The resulting photosensitive member is subjected to image-wise exposure with actinic radiation in a conventional manner. The radiation is usually near ultraviolet and visible light having a wavelength of from about 290 to 500 nm. Suitable radiation sources for such image exposure include a xenon lamp, a carbon arc lamp, an incandescent lamp, a fluorescent lamp, natural sunlight, etc.

To realize a positive working process, one may perform ordinary development after image-wise exposure. To realize a negative working process, one must heat the exposed member. This heat treatment promotes insolubilization of the exposed areas. Such heating can be carried out at the same time or after image exposure. A suitable temperature is about 70° to 300° C. and more preferably about 90° to 270° C. Lower temperatures, e.g., 30° to 70° C. require a relatively long time while temperatures above 300° C. suppress the photographic speed in the unexposed areas thus causing post exposure using an actinic radiation after heat treatment to undesirably increase. Based on these considerations the temperature range described above was selected.

To heat the photosensitive member, the member may be placed in a heated atmosphere (e.g., an oven), immersed in a heated fluid, or brought it into contact with a heated solid, etc.

The member thus treated is irradiated with active light. This procedure renders the areas which have not been exposed in the first exposure, removable upon subsequent development. Accordingly, at least the areas which have not been exposed by the first exposure must be subjected to active light before development. However, since the complimentary exposed image areas have already lost their photosensitivity and no chemical change takes place upon further exposure to active light, blank or uniform exposure is usually adopted from the viewpoint of operating efficiency. Light sources suitable for image exposure can also be employed for the blank exposure. The blank exposure may be performed at any time after heat treatment. At the time of blank exposure, the member may be at ambient temperature or in a somewhat warm state above ambient temperature.

Development after these treatments causes the unexposed areas to dissolve away. The developer may be selected from those conventionally used for the positive working materials containing o-quinonediazide compounds. Practically development is readily performed by immersing or spraying the element with an alkaline fluid. Suitable alkaline solutions include aqueous solutions of inorganic bases such as sodium hydroxide, potassium hydroxide, sodium silicate, potassium silicate, sodium phosphate, potassium phosphate, sodium carbonate, potassium carbonate, etc.; and organic bases such as monoethanolamine, diethanolamine, triethanolamine, tetramethylammonium hydroxide, etc. The developer can contain organic solvents or surfactants, etc.

Since the present invention enables one to achieve positive and negative working processes with only one type of photosensitive member and by use of a single developer as well as a single processor, the operator is liberated from the need to choose a particular photosensitive material, developer and processor depending on the type of original he has to work with.

Below, the present invention will be described in more detail by reference to the following examples which are provided for illustration but not as a limitation on the invention. Unless otherwise indicated all parts are by weight.

EXAMPLE 1

1 part 1,2-naphthoquinonediazide-5-sulfonic acid ester of the polyhydroxybenzene prepared by condensation polymerization of acetone and pyrogallol in accordance with Example 1 in Japanese Patent Publication No. 28403/68 (corresponding to U.S. Pat. No. 3,635,709), 2 parts phenol resin (available from Sumitomo Durez Co. under the trade name "PR-50904", degree of polymerization: 3-10) and 0.15 part 1,2-benzanthraquinone were dissolved in a mixture of 20 parts methyl ethyl ketone and 20 parts methyl cellosolve acetate to provide a photosensitive coating solution. Further, vacuum deposition was carried out on a 100 μm thick clean poly(ethylene terephthalate) (PET) film such that an atomic ratio of aluminum to iron was 98.5:1.5 whereby a vacuum deposited PET film having a thickness of 70 nm was prepared.

The photosensitive coating solution prepared above was coated on the PET film by means of a whirler such that the dry thickness of the photosensitive layer was about 1 μm. The coated product was divied into two pieces, A and B. Sample A was exposed for 15 seconds through a positive original to light from a 2 kw ultra high pressure mercury lamp placed at a distance of 55 cm. Sample B was exposed through a negative original under the same exposure condition. After this image exposure, Sample B was kept in a thermostat maintained at 120° C. for 20 minutes and then uniformly irradiated by the same light source as used for image exposure for 15 seconds. Finally the two film samples were immersed in a developer prepared by dissolving 4 g sodium hydroxide, 10 g potassium bromate and 10 g sodium phosphate in 1 liter of water at 31° C. for 20 seconds. For Sample A, the vacuum-deposited metallic layer at the exposed areas dissolved away while the overcoated photosensitive layer remained together with the metallic layer. For Sample B, the image sense reversed; i.e., the photosensitive layer and the vacuum-deposited metallic layer remained in the exposed area and the complimentary areas were transparent. The resulting image which sense was positive for each of Samples A and B had excellent quality with no background at all.

EXAMPLE 2

The procedures set forth in Example 1 were precisely repeated except that 1,2-benzanthraquinone was replaced by perinaphthenone. Similarly, positive and negative mode image forming methods were possible with the same developer.

EXAMPLE 3

The procedures set forth in Example 1 were precisely repeated except that 1,2-benzanthraquinone was replaced by fluorenone. Similarly, positive and negative images were possible with the same developer.

While the invention has been described in detail and with reference to specific embodiments thereof, it will be apparent to one skilled in the art that various changes and modifications can be made therein without departing from the spirit and scope thereof.

What is claimed is:

1. An image forming method comprising image-wise exposing with actinic radiation a positive-working and negative-working photosensitive member comprising a photosensitive layer and a support, said photosensitive layer containing an o-benzo- or o-naptho-quinonediazide sulfonic acid ester of a hydroxy compound as a photosensitive agent and an additive selected from a quinone or an aromatic ketone compound, heating said member at about 70° to 300° C. concurrent with or subsequent to exposure to insolubilize the exposed areas, post-exposing said member to actinic radiation to render unexposed areas removable upon development and developing said member with a common alkaline developer to remove unexposed areas, and wherein said quinone compound is selected from the group consisting of anthraquinone, 1-methylanthraquinone, 2-methylanthraquinone, 2-t-butylanthraquinone, 1-acetylamino-4-nitroanthraquinone, 1,2-benzanthraquinone, 2,3-triazoylanthraquinone, phenanthraquinone, 1-methylphenanthraquinone, and benzphenanthraquinone, and wherein said aromatic ketone compound is selected from the group consisting of perinaphthenone, xanthone, thioxanthone, benzanthrone, 3-chlorobenzanthrone, naphthofuranone, 4-phenylnaphthofuranone, indenone, 2,3-diphenylindenone, benzophenone, and benzalacetophenone.

* * * * *